(12) United States Patent
Monoe

(10) Patent No.: US 7,115,447 B2
(45) Date of Patent: Oct. 3, 2006

(54) MANUFACTURING SEMICONDUCTOR DEVICE INCLUDING FORMING LDD REGION USING CONDUCTIVE LAYER AS MASK

(75) Inventor: Shigeharu Monoe, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/603,944

(22) Filed: Jun. 26, 2003

(65) Prior Publication Data

US 2004/0087125 A1    May 6, 2004

(30) Foreign Application Priority Data

Jul. 1, 2002    (JP)    ............... 2002-192384

(51) Int. Cl.
  *H01L 21/00*    (2006.01)
  *H01L 21/84*    (2006.01)
(52) U.S. Cl. .................... 438/149; 438/164
(58) Field of Classification Search ............... 438/149, 438/164
  See application file for complete search history.

(56) References Cited

U.S. PATENT DOCUMENTS

| 6,235,558 | B1 | 5/2001 | Oda et al. |
| 6,646,287 | B1 | 11/2003 | Ono et al. |
| 6,759,678 | B1 | 7/2004 | Yamazaki et al. |
| 6,909,114 | B1 | 6/2005 | Yamazaki |
| 2001/0030322 | A1 | 10/2001 | Yamazaki et al. |
| 2001/0035526 | A1 | 11/2001 | Yamazaki et al. |
| 2001/0052950 | A1 | 12/2001 | Yamazaki et al. |
| 2001/0055841 | A1 | 12/2001 | Yamazaki et al. |
| 2002/0000551 | A1 | 1/2002 | Yamazaki et al. |
| 2002/0158288 | A1 | 10/2002 | Yamazaki et al. |

FOREIGN PATENT DOCUMENTS

| EP | 1 003 223 A2 | 5/2000 |
| EP | 1 128 430 A2 | 8/2001 |
| JP | 07-106346 | 4/1995 |
| JP | 08-45906 | 2/1996 |
| JP | 10-10752 | 1/1998 |
| JP | 2000-294787 | 10/2000 |
| JP | 2001-313397 | 11/2001 |
| JP | 2002-14337 | 1/2002 |

OTHER PUBLICATIONS

M. Nagase et al.; "Study of sub-30nm gate Etching Technology"; *2001 Dry Process International Symposium*; pp. 17-22; 2001.

*Primary Examiner*—George Fourson
*Assistant Examiner*—Fernando L. Toledo
(74) *Attorney, Agent, or Firm*—Fish & Richardson P.C.

(57) ABSTRACT

A gate electrode is formed of a laminate structure comprising a plurality of conductive layers such that the width along the channel of a lower first conductive layer is larger than that of an upper second conductive layer. The gate electrode is used as a mask during ion doping for forming an LDD. A mask pattern for forming the gate electrode is processed into an optimum shape in combination with dry etching so that the LDD overlapping with the gate electrode (Lov) is 1 μm or more, and preferably, 1.5 μm or more.

18 Claims, 12 Drawing Sheets

Ions are irradiated, and a reaction by-product is not deposited to a sidewall.

Ions are not irradiated, and a reaction by-product is deposited to a sidewall.

The reaction by-product is remained.

MANUFACTURING SEMICONDUCTOR DEVICE INCLUDING FORMING LDD REGION USING CONDUCTIVE LAYER AS MASK

BACKGROUND OF THE INVENTION

1. Field of the Invention

The present invention relates to a method of manufacturing an insulating gate field-effect transistor. In particular, the present invention relates to a method of manufacturing a semiconductor device that can be applied to a thin film transistor (TFT) having a gate overlapping structure.

2. Related Art

A display device using a liquid crystal has been put to practical use in a 20-inch or more large-screen that is typified by liquid crystal display TV. In recent years, a liquid crystal display device integrated with driving circuit that comprises TFT in which a polycrystalline silicon film is used as an active layer is realized.

However, there is a problem that the TFT using a polycrystalline silicon film result in lower withstanding pressure of drain junction. It resulted that junction leak current (hereinafter, OFF-leak current) is increased. It is known that a lightly doped region (LDD) is effective for reducing the OFF-leak current.

The problem is pointed out that high electric field is generated at the vicinity of the drain region, then, hot carriers are trapped by a gate insulating film on the LDD region, and then, a device characteristic such as threshold value is greatly deteriorated. The TFT in which the gate electrode is overlapped with the LDD region to prevent the deterioration of hot carriers is disclosed in JP 2001-294787. The gate overlapped LDD structure TFT has higher current driving ability compared to the normal LDD structure TFT, and suppresses the deterioration due to hot carriers by easing effectively the high electric field at the vicinity of the drain region.

However, according to the gate overlapped LDD structure TFT disclosed in above publication, an impurity region for forming an LDD region is formed on the semiconductor layer, then, the gate electrode is formed thereon to overlap with the LDD region. The manufacturing method cannot regulate accurately the portion that is overlapping with the gate electrode along with the miniaturization of design rule.

On the other hand, the preferred example of manufacturing the gate overlapping LDD structure TFT in a self-aligning manner is disclosed in JP2002-14337. The technique disclosed in the publication is that at least two layered conductive layer is subjected to once exposure and plural etching, then, the upper layer and the lower layer are formed to have different thickness and shape, and then, an ion doping is conducted thereon. Consequently, an LDD region that is overlapped with a gate electrode can be formed in a self-aligning manner.

Of course, it is necessary that the LDD length (the length for channel length) is optimized depending on the driving voltage of TFT in order to maximize the functions of the LDD overlapped with the gate electrode as a countermeasure against deteriorations due to hot carriers. That is, there is optimum length for easing effectively the high electric field region in the vicinity of the drain region.

The technique disclosed in above-mentioned publication has two steps: in the first step, two laminated conductive layers are subjected to etching to have a taper shape, in the second step, only the upper layer of the laminated conductive layers in the taper shape is selectively subjected to anisotropic etching, and can regulate LDD length by controlling the taper angle.

SUMMARY OF THE INVENTION

In order to etch not only the gate electrode but also an edge portion or a side wall portion of a film in accordance with mask pattern, the etching is performed with trimming the width of a mask pattern by dry etching. For that purpose, the selection of kinds of gas for etching, the regulation of bias voltage, and the selection ratio of materials of mask pattern and film are important matters.

In the conventional technique using the gate electrode having at least two layers laminated structure, it is necessary that a taper angle (an angle with the substrate surface) is decreased during processing steps of the gate electrode in order to regulate LDD length. For that purpose, the mask pattern must be largely trimmed. The mask pattern should leave a margin for thickness since it will be trimmed. It results in a problem that a microscopic mask pattern cannot be formed.

With respect to an issue concerning selective ratio of etching processing, the relationship between etching gas and the subject needs to be considered. An area of display device, the problem of signal delay should be solved along with growing in size of screen. It is necessary to use materials having low resistivity typified by aluminum. Specifically, sheet resistance needs at most 0.2 Ω/in consideration of approximately 20-inch screen.

In order to drive a TFT having channel portion 10 µm in length at 10 to 20 V, LDD region needs at least 1 µm (preferably, 1.5 µm) in length (length of overlapping portion with the gate electrode). In this case, it is necessary to form approximately 20° taper angles with aluminum film having 0.5 µm in thickness have according to the above-mentioned conventional technique. However, since aluminum is hard to be subjected to taper processing, such small taper angle cannot be formed by dry etching.

In view of the foregoing, an object of the present invention is to provide a method of manufacturing TFT, through which the flexibility is brought in design of LDD that is overlapping with the gate electrode that is formed in a self-aligning manner, in particular, TFT that is resistant to hot carriers can be formed with repeatability.

The applicant has considered the length of an LDD overlapping with a gate electrode (hereinafter, referred to as Lov for the sake of convenience), which is necessary for reducing hot-carrier-induced degradation of a thin-film transistor (TFT) as follows.

First, defining the time until the maximum field-effect mobility decreases by 10% as lifetime when the Lov relative to the degradation of a TFT is a predetermined value, voltages at which the lifetime becomes ten years are derived as ten-year guaranteed voltages from a linear relationship obtained by plotting the reciprocal of a drain voltage on a semilogarithmic graph, as shown in FIG. 11. For example, in FIG. 11, the ten-year guaranteed voltage of a TFT with a length Lov of 1.0 µm is 16 V. FIG. 12 is the plot of the values of the estimated guaranteed voltages thus obtained when the Lov is 0.5 µm, 0.78 µm, 1.0 µm, 1.5 µm, and 1.7 µm. FIG. 12 also shows drain voltages as 20-hour guaranteed voltages, at which the time until the ON-state current of the TFT changes by 10% is 20 hours in a bias stress test.

The hot-carrier-induced degradation is insignificant with low driving voltage, however, it becomes non-negligible with a driving voltage of 10 V or more. FIG. 12 clearly shows that when the driving voltage is 16 V, the Lov must be 1 μm, and preferably, 1.5 μm or more.

In order to satisfy the above requirements, the present invention provides a process for producing a semiconductor device by which an LDD overlapping with a gate electrode is formed by self alignment, wherein a gate electrode is formed of a laminate structure comprising a plurality of conductive layers, which is shaped such that the width along the channel length of a lower first conductive layer is larger than that of a second conductive layer, and the gate electrode is used as a mask during ion doping for forming an LDD. At that time, a mask pattern for forming the gate electrode is processed into an optimum shape, in combination with dry etching in order that the LDD overlapping with the gate electrode (Lov) is 1 μm or more, and preferably, 1.5 μm or more.

A process according to the invention comprises the steps of: forming a laminate structure comprising a lower first conductive layer and an upper second conductive layer over a semiconductor layer with a gate insulating film interposed therebetween; forming a mask pattern on the laminate structure; forming a first conductive layer pattern having a tapered edge by etching the second conductive layer and the first conductive layer; recessing the edge of the mask pattern remaining on the first conductive layer pattern; and forming a second conductive layer pattern by selectively etching the second conductive layer in the first conductive layer pattern in accordance with the mask pattern. Accordingly, a second conductive layer pattern is formed in which the width along the channel length of the lower first conductive layer is larger than that of the upper second conductive layer. The projection length of the first conductive layer can be 1 μm or more, which is used as a mask for shielding ions accelerated by an electric field, so that an LDD region overlapping with the second conductive layer pattern can be formed. In other words, the LDD region can be formed by self alignment. Of course, the second conductive layer pattern can be used as a gate electrode.

In the above arrangement, preferably, the first conductive layer is made of tungsten, and the second conductive layer is made of aluminum or metal having aluminum as the main component. Preferably, the edge of the mask pattern is recessed by oxygen plasma treatment.

A process according to the invention comprises the steps of: forming a laminate structure over a semiconductor layer by sequentially depositing a first conductive layer, a second conductive layer, and a third conductive layer with a gate insulating film interposed therebetween; forming a mask pattern thereon; forming a first conductive layer pattern having a tapered edge; recessing the edge of the mask pattern remaining on the first conductive layer pattern; and forming a second conductive layer pattern by selectively etching the third conductive layer and the second conductive layer in the first conductive layer pattern in accordance with the mask pattern. Accordingly, a second conductive layer pattern is formed in which the width along the channel length of the lower first conductive layer is larger than that of the upper second conductive layer. The projection length of the first conductive layer can be 1 μm or more, which is used as a mask for shielding ions accelerated by an electric field, so that an LDD region overlapping with the second conductive layer pattern can be formed. In other words, the LDD region can be formed by self alignment. Of course, the second conductive layer pattern can be used as a gate electrode.

In the above arrangement, preferably, the first conductive layer is made of tungsten, the second conductive layer is made of aluminum or alloy or compound having aluminum as the main component, and the third conductive layer is made of titanium nitride. Preferably, the edge of the mask pattern is recessed by oxygen plasma treatment.

A process according to the invention comprises the steps of: forming a laminate structure comprising a lower first conductive layer and an upper second conductive layer over a semiconductor layer with a gate insulating film interposed therebetween; forming a mask pattern thereon; performing plasma treatment for decreasing the taper angle of the edge of the mask pattern; forming a first conductive layer pattern having a tapered edge by etching the second conductive layer and the first conductive layer of the laminate structure by using the mask pattern; forming a second conductive layer pattern by selectively etching the second conductive layer in the first conductive layer pattern. Accordingly, a second conductive layer pattern is formed in which the width along the channel length of the lower first conductive layer is larger than that of the upper second conductive layer. The projection length of the first conductive layer can be 1 μm or more, which is used as a mask for shielding ions accelerated by an electric field, so that an LDD region overlapping with the second conductive layer pattern can be formed. In other words, the LDD region can be formed by self alignment. Of course, the second conductive layer pattern can be used as a gate electrode.

In the above arrangement, preferably, the first conductive layer is made of tungsten and the second conductive layer is made of aluminum or metal having aluminum as the main component. Preferably, the edge of the mask pattern is recessed by oxygen plasma treatment.

A process according to the invention comprises the steps of: forming a laminate structure over a semiconductor layer by sequentially depositing a first conductive layer, a second conductive layer, and a third conductive layer with a gate insulating film interposed therebetween; forming a mask pattern thereon; performing plasma treatment for etching the third conductive layer and decreasing the taper angle of the edge of the mask pattern; forming a first conductive layer pattern having a tapered edge by etching the second conductive layer and the first conductive layer of the laminate structure by using the mask pattern; forming a second conductive layer pattern by selectively etching the second conductive layer in the first conductive layer pattern. Accordingly, a second conductive layer pattern is formed in which the width along the channel length of the lower first conductive layer is larger than that of the upper second conductive layer. The projection length of the first conductive layer can be 1 μm or more, which is used as a mask for shielding ions accelerated by an electric field, so that an LDD region overlapping with the second conductive layer pattern can be formed. In other words, the LDD region can be formed by self alignment. Of course, the second conductive layer pattern can be used as a gate electrode.

In the above arrangement, preferably, the first conductive layer is made of tungsten, the second conductive layer is made of aluminum or alloy or compound having aluminum as the main component, and the third conductive layer is made of titanium nitride. Preferably, the width of the mask pattern is decreased by plasma treatment using a fluorine-based gas.

In the process of forming a gate electrode in a laminate structure comprising a plurality of conductive layers such that the width along the channel length of a first conductive layer is larger than that of a second conductive layer, a step of recessing a mask pattern into a narrow shape is provided between a taper etching process and an anisotropic etching process, so that the length along the channel of the first conductive layer can be 1 μm or more. The use of the gate electrode as a mask during ion doping allows the length of an LDD region overlapping with the gate electrode to be 1 μm or more and increases the lifetime of the TFT against hot-carrier-induced degradation.

The invention can be applied to processes for producing various semiconductor devices comprising MOS transistors formed on a monocrystal semiconductor substrate if only they are transistors having an LDD structure overlapping with a gate electrode.

DESCRIPTION OF THE PREFERRED EMBODIMENTS

Figure 1A:
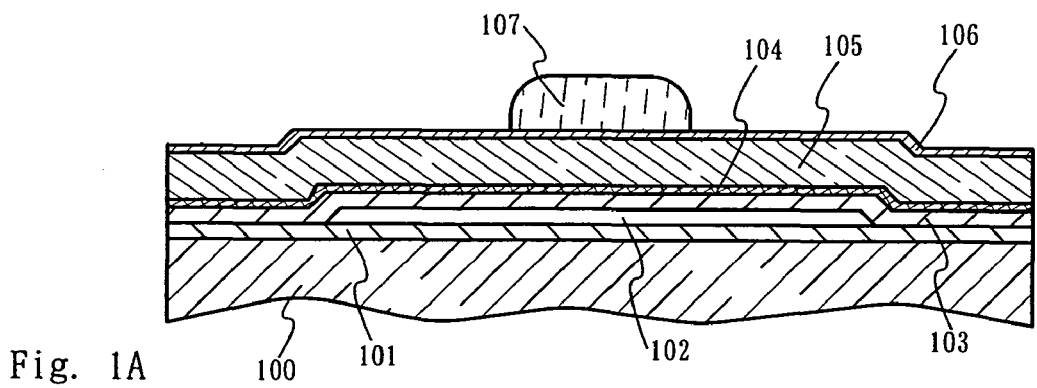
FIGS. 1A to 1E are sectional views for explaining a process for producing a semiconductor device according to the present invention.

Embodiments of the present invention will be specifically described hereinafter with reference to the drawings. It should be understood that the invention is not limited to the following embodiments and that various modifications may be made without departing from the spirit and scope thereof. The same elements throughout the following embodiments are given the same reference numerals.

[First Embodiment]

In this embodiment, a process will be described in which a gate electrode is used as a mask during ion doping, an LDD overlapping with the gate electrode (Lov) is formed by self alignment, and the length of Lov can be 1 μm or more. More specifically, after a first conductive layer pattern has been formed, the edge of a mask pattern remaining thereon is recessed, and a second conductive layer in the first conductive layer pattern is in turn selectively etched to form a second conductive layer pattern in accordance with the mask pattern.

Referring to FIG. 1A, a first insulating film (base film) 101, a semiconductor layer 102, and a second insulating film (gate insulating film) 103 are formed on a glass substrate 100, on which a first conductive layer 104, a second conductive layer 105, and a third conductive layer 106 are formed. A mask pattern 107 is formed of a photoresist by photolithographic processing.

The first conductive layer 104 is formed of high-melting metal with a thickness of 30 to 50 nm, such as tungsten (W), chromium (Cr), tantalum (Ta), titanium (Ti), and molybdenum (Mo). The second conductive layer 105 is formed of aluminum or alloy or compound having aluminum as the main component (typically, alloy or compound having aluminum and 0.1–5 wt % of one or a plurality of components selected from the group of titanium, silicon, scandium, and niobium) in a thickness of 300 to 600 nm. This is for the purpose of increasing the heat stability of aluminum to prevent the occurrence of aluminum spike.

The third conductive layer 106 is formed of high-melting metal such as tungsten (W), chromium (Cr), and titanium (Ti) or their nitride. The third conductive layer 106 is provided to improve the heat resistance of the laminate structure having aluminum as the main component and is not the essential component for the invention. Combination with tungsten used as the first conductive layer facilitates selective processing, since titanium nitride can be processed with the same etching gas as that for aluminum.

Figure 1B:
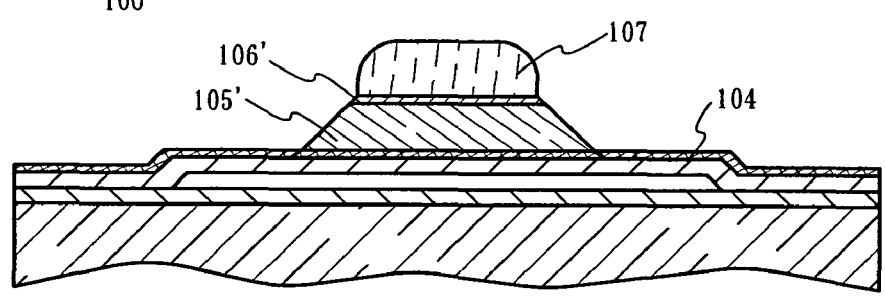

Referring next to FIG. 1B, the second conductive layer 105 and the third conductive layer 106 are etched by dry etching. A mixture of boron trichloride ($BCl_3$), chloride ($Cl_2$), and carbon tetrafluoride ($CF_4$) is used as etching gas. To increase etching rate, a dry etching device that uses a high-density plasma source such as electron cyclotron resonance (ECR) or inductively coupled plasma (ICP). In order to process the edge or the sidewall in a tapered shape in accordance with the mask pattern, a negative bias voltage is applied to the substrate side.

Figure 3A:
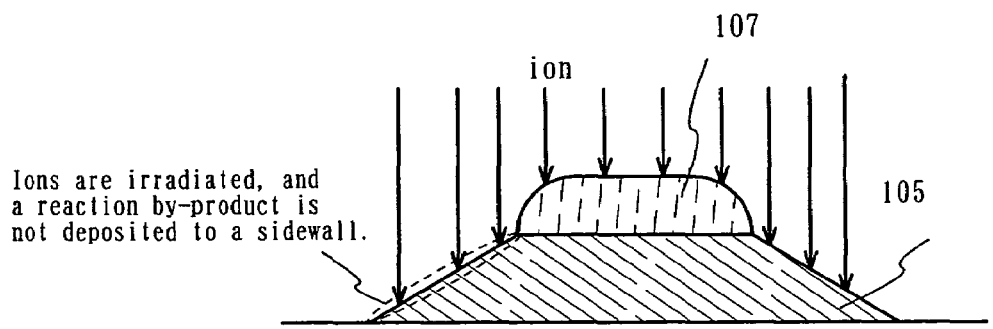
FIGS. 3A and 3B are diagrams for explaining a reaction by-product removing effect by taper etching.
Figure 3B:
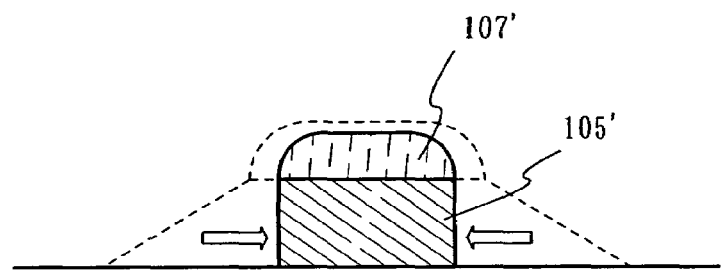
Figure 4A:
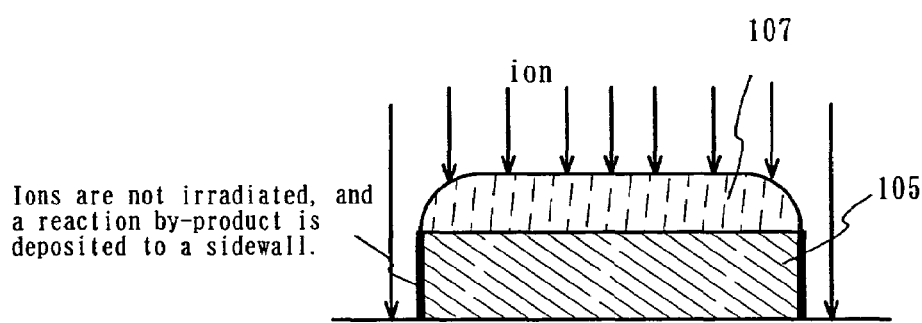
FIGS. 4A and 4B are diagrams for explaining the effects of a reaction by-product when the taper etching is not performed.
Figure 4B:
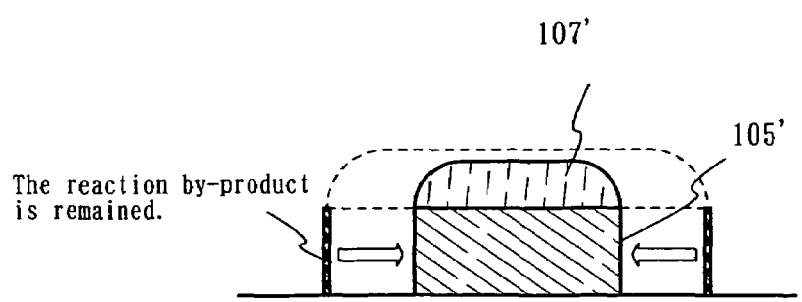

The photoresist mask pattern 107 is sputtered by ions accelerated by an electric field, so that a reaction by-product is adhered to the sidewall of the workpiece. This is also called a sidewall protective film. The reason why the second conductive layer 105 having aluminum as the main component is tapered in this process step is to remove the sidewall protective film. More specifically, when the tapered second conductive layer 105 is etched anisotropically thereafter, as shown in FIG. 3A, the reaction by-product is hardly deposited on the sidewall, so that it can be etched without a residue to form the pattern of a second conductive layer 105', as shown in FIG. 3B. On the other hand, when the sidewall of the second conductive layer 105 is substantially vertical, as shown in FIG. 4A, a reaction by-product is deposited during etching, therefore, when it is etched anisotropically thereafter, the reaction by-product remains to cause malformation, as shown in FIG. 4B. In other words, when at least the second conductive layer 105 is tapered in this process step, the sidewall protective film can be removed.

Figure 1C:
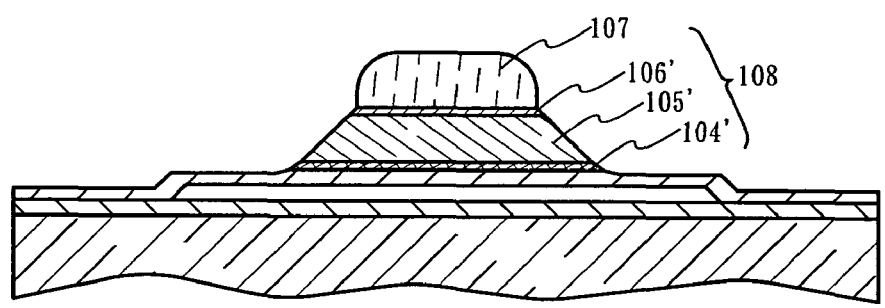

Referring then to FIG. 1C, the etching gas is changed to a mixture of $CF_4$, $Cl_2$, and oxygen ($O_2$) to etch tungsten that is the first conductive layer 104. Of course, although all the conductive layers may be etched at the same time, the etching time for the thick second conductive layer 105 must be set longer in consideration of the variations in etching rate. In such a case, when the base film is made of silicon oxide, it is etched to become extremely thin. Therefore, in order to prevent it, the two-stage etching is performed.

In this way, a first conductive layer pattern 108 formed of a first conductive layer 104', the second conductive layer 105', and a third conductive layer 106' is formed on the second insulating film 103, as shown in FIG. 1C. The angle formed by the tapered edge of the first conductive layer pattern 108 and the substrate 100 is set to 10 to 20 degrees. The angle is determined mainly depending on the relationship with the film thickness of the second conductive layer 105', however, the length of the tapered section is set to about 0.5 to 1.5 µm.

Figure 1D:
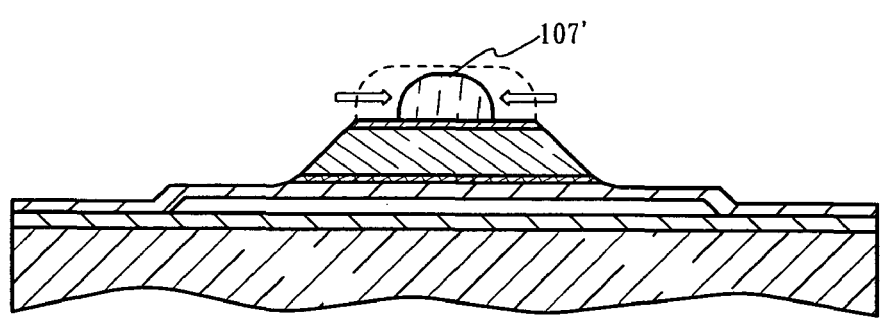

Thereafter, the edge of the photoresist mask pattern 107 is recessed by oxygen plasma treatment. The photoresist serving as the member of the mask pattern 107 is etched by the oxygen plasma treatment to be reduced entirely. The recess width of the pattern can freely be set depending on the treatment time. The length of Lov can be substantially determined depending on the recess width (refer to FIG. 1D).

Figure 1E:
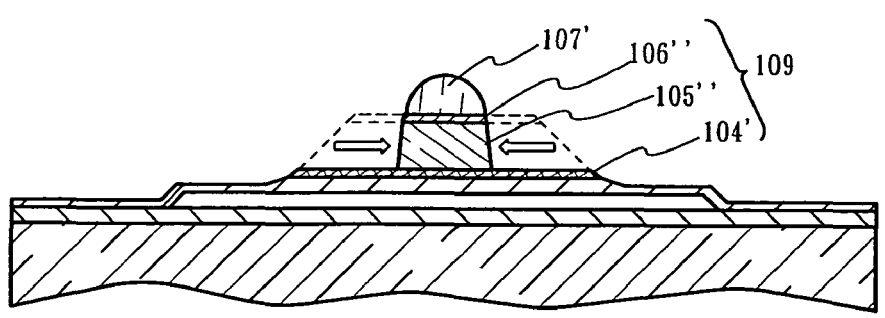

The second conductive layer 105' and the third conductive layer 106' are selectively etched in accordance with a mask pattern 107' using a mixture of $BCl_3$ and $Cl_2$ as etching gas. In this case, the bias voltage to be applied to the substrate side is decreased to thereby leave the first conductive layer 104'. The edge of the second conductive layer 105' is recessed inward from the first conductive layer 104', and the length of Lov is determined depending on the recess width, as will be described later. In this manner, a second conductive layer pattern 109 formed of the first conductive layer 104', a second conductive layer 105'', and a third conductive layer 106'' is formed, which acts as a gate electrode at a part intersecting with the semiconductor layer 102 (refer to FIG. 1E).

Figure 2A:
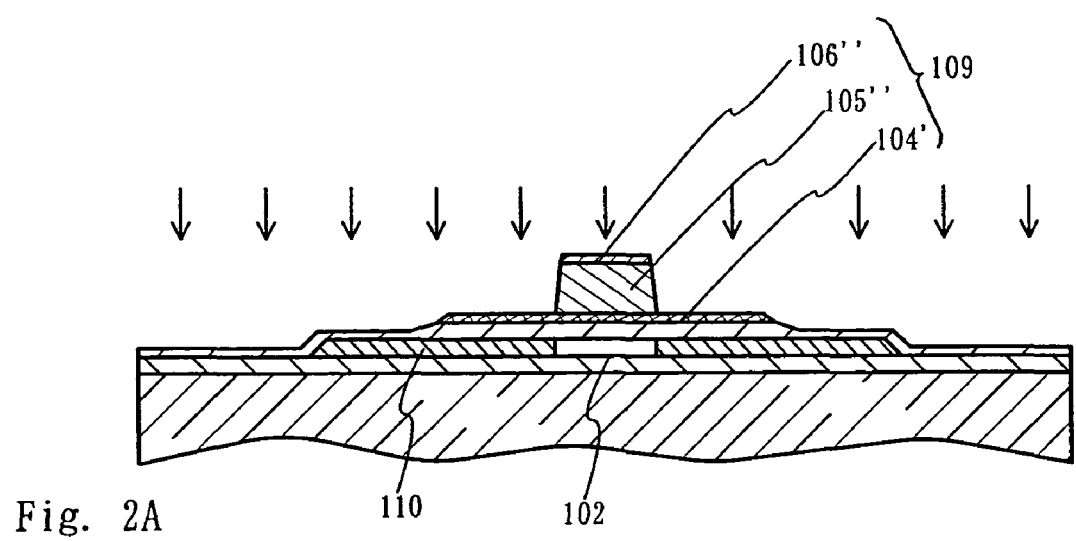
FIGS. 2A to 2C are sectional views for explaining a process for producing the semiconductor device according to the present invention.

The addition of one-conduction type impurity to the second insulating film 103, that is, the formation of an LDD or a source/drain region can be performed by self alignment using the second conductive layer pattern 109. FIG. 2A shows a doping process for forming an LDD that overlaps with the gate electrode, wherein ions of the one-conduction type impurity are passed through the first conductive layer 104' and are added to the semiconductor layer 102 thereunder to form a first-concentration one-conduction type impurity region 110. In this case, an acceleration voltage of 50 kV or more is required depending on the film thickness of the second insulating film 103 and the first conductive layer 104'. The concentration of the impurity in the first-concentration one-conduction type impurity region 110 is set at $1 \times 10^{16}$ to $5 \times 10^{18}/cm^3$ (peak value) in the case of the LDD.

In the doping process for forming a source/drain region, the second conductive layer pattern 109 is used as a mask for shielding ions and a second-concentration one-conduction type impurity region 111 is formed on the outside of the first-concentration one-conduction type impurity region 110. In such a case, the acceleration voltage is set at 30 kV or less. The concentration of the impurity in the second-concentration one-conduction type impurity region 111 is set at $1 \times 10^{19}$ to $5 \times 10^{21}/cm^3$ (peak value).

Then, a third insulating film 112 made of silicon nitride, a fourth insulating film 113 made of a low-dielectric organic compound material, and a wire 114 are formed.

As described above, according to the embodiment, a TFT that has an LDD overlapping with a gate electrode (Lov) and having a length of 1 µm or more can be formed by self alignment using the gate electrode as a mask during ion doping. Since the length of the LDD region overlapping with the gate electrode is 1 µm or more, the lifetime of the TFT can be increased against hot-carrier-induced deterioration.

[Second Embodiment]

In this embodiment, a process will be described in which a gate electrode is used as a mask during ion doping, an LDD overlapping with the gate electrode (Lov) is formed by self alignment, and its length can be 1 µm or more. More specifically, a mask pattern is formed on a laminate structure for forming a gate electrode, the mask pattern is subjected to plasma treatment to decrease the taper angle of the edge thereof, the laminate structure is etched using the mask pattern to form a first conductive layer pattern having a tapered edge, and a second conductive layer in the first conductive layer pattern is selectively etched to form a second conductive layer pattern.

Figure 5A:
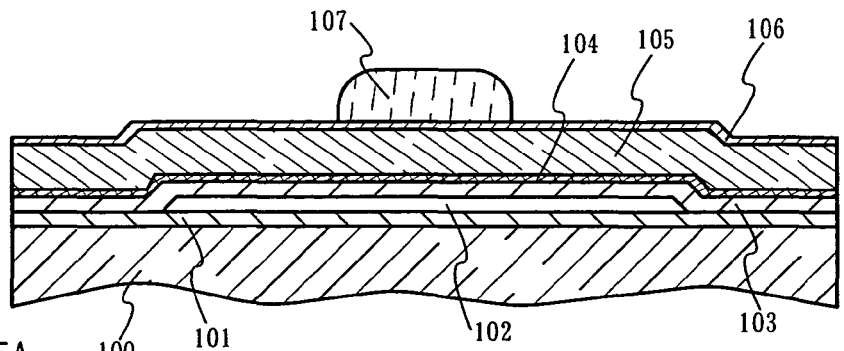
FIGS. 5A to 5E are sectional views for explaining another process of producing a semiconductor device according to the present invention.

First, as in the first embodiment of FIG. 1A, the first insulating film 101, the semiconductor layer 102, the second insulating film 103, the first conductive layer 104, the second conductive layer 105, the third conductive layer 106, and the mask pattern 107 are formed on the substrate 100 (refer to FIG. 5A).

Next, the taper angle at the edge of the mask pattern 107 is decreased by plasma treatment. At the same time, the third conductive layer 106 is reduced. An applicable etching gas is a fluorine-based gas, such as sulfur hexafluoride ($SF_6$) and nitrogen trifluoride ($NF_3$).

Figure 5B:
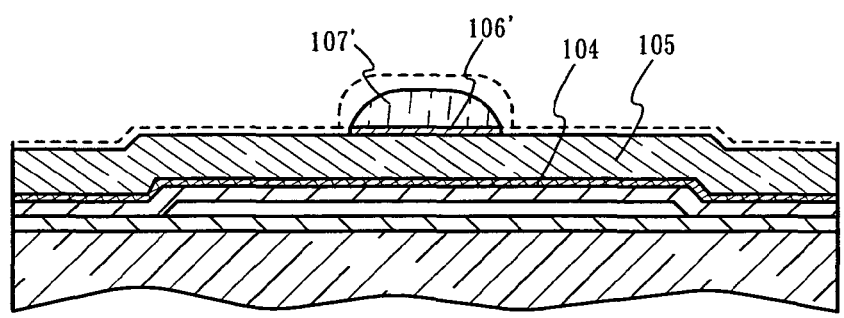

The taper angle is an angle formed by the surface of the substrate 100 and the sidewall of the mask pattern 107, or an angle formed by the mask pattern 107 and the surface of the layer thereunder. A taper angle $\alpha 2$ after the plasma treatment can be decreased relative to a taper angle $\alpha 1$ in the initial state of the mask pattern 107. More specifically, the resist is etched by the fluorine-based gas, so that the edge is recessed and also the taper angle is decreased. At that time, the mask pattern 107 is preferably tapered to a certain extent rather than rectangular in initial cross section, because the amount of recess can be increases. FIG. 5B shows the mask pattern 107' and the third conductive layer 106' after the plasma treatment.

Figure 5C:
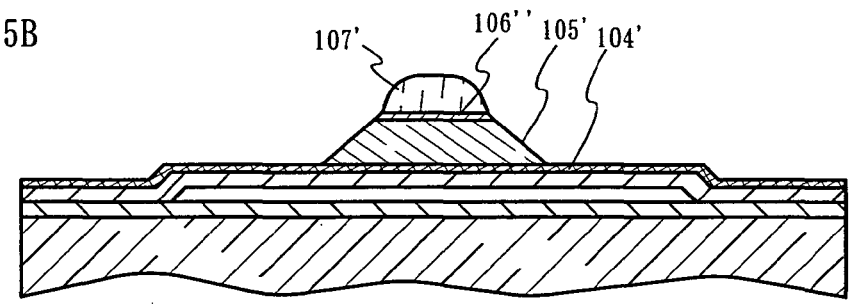

Then, referring to FIG. 5C, the second conductive layer 105 and the third conductive layer 106' are etched by dry etching. A mixture of $BCl_3$, $Cl_2$, and $CF_4$ are used as etching gas. In order to process the edge or the sidewall into tapered shape in accordance with the mask pattern 107', a negative bias voltage is applied to the substrate side. Decreasing the taper angle of the edge of the mask pattern 107' in the previous process step increases the amount of the recess of the mask pattern 107' and to decrease the taper angle of the sidewall of the second conductive layer 105 to be etched by the etching process.

Figure 5D:
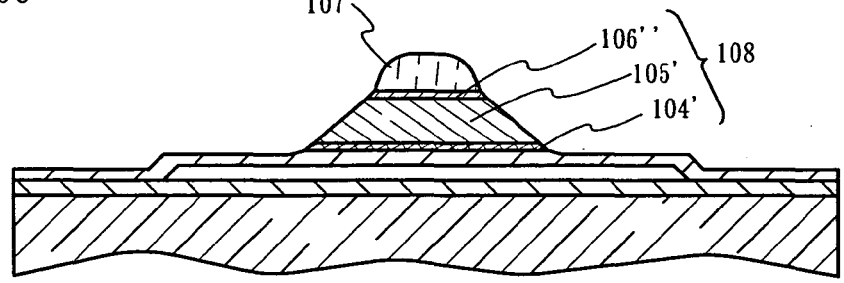

Then, referring to FIG. 5D, the etching gas is changed to $CF_4$, $Cl_2$, and $O_2$ to etch tungsten that is the first conductive layer 104. In this way, the first conductive layer pattern 108 formed of the first conductive layer 104', the second conductive layer 105', and the third conductive layer 106' is formed on the second insulating film 103. The angle formed by the tapered edge of the first conductive layer pattern 108 and the surface of the substrate 100 is set to 10 to 20 degrees. The angle is determined mainly depending on the relationship with the film thickness of the second conductive layer 105', the length of the tapered section is set to about 0.5 to 1 µm.

Figure 5E:
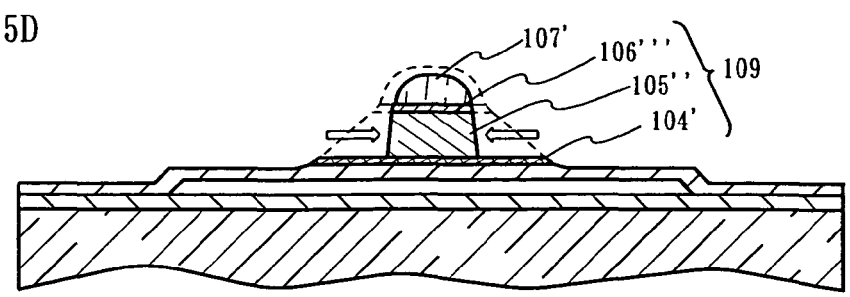

The second conductive layer 105' and the third conductive layer 106' are selectively etched in accordance with the mask pattern 107' using BCl₃ and Cl₂ as etching gas. In this case, the bias voltage to be applied to the substrate side is decreased to thereby leave the first conductive layer 104'. The edge of the second conductive layer 105' is recessed inward from the first conductive layer 104', and the length of Lov is determined depending on the recess width, as will be described later. In this manner, the second conductive layer pattern 109 formed of the first conductive layer 104', the second conductive layer 105", and the third conductive layer 106''' is formed, which acts as a gate electrode at a part intersecting with the semiconductor layer 102 (refer to FIG. 5E).

Figure 2B:
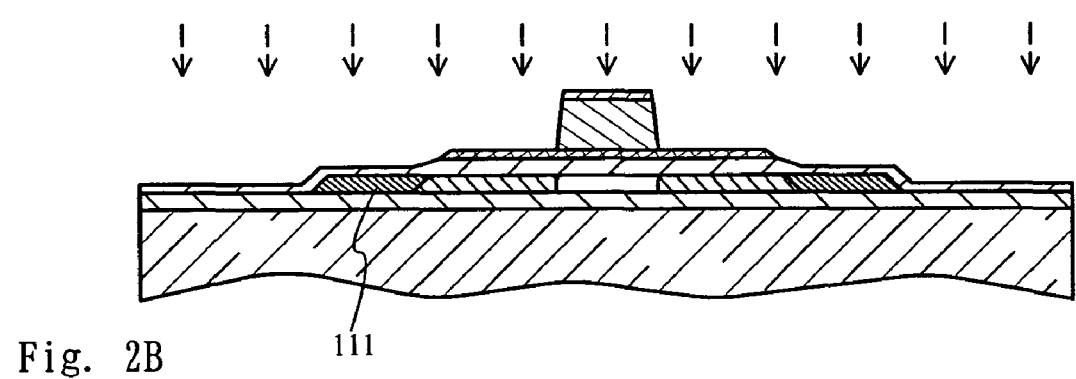
Figure 2C:
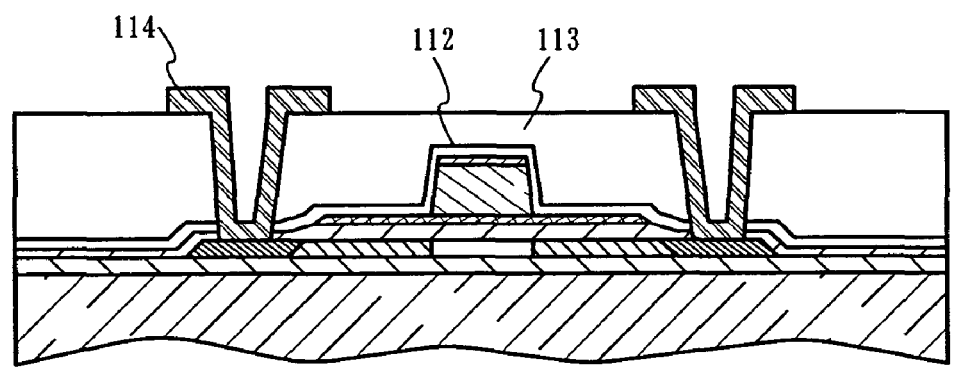

Hereinafter, according to the procedure shown in FIGS. 2A to 2C, as in the first embodiment, an LDD overlapping with the gate electrode (Lov) is formed by self alignment, and a TFT having an Lov length of 1 µm or more is formed. Thus, since the length of the LDD region overlapping with the gate electrode can be 1 µm or more, the lifetime of the TFT can be increased against hot-carrier-induced degradation.

EXAMPLES

Example 1

An example of forming a gate electrode according to the procedure of the first embodiment will be described. The present example will be discussed with reference to FIGS. 1A to 1E.

First, the first insulating film 101 is formed of a silicon oxynitride film of 150 nm in thickness on the aluminosilicate-glass substrate by plasma chemical-vapor deposition (CVD). The semiconductor layer 102 is made of a crystalline silicon film formed by crystallizing an amorphous silicon film of 50 nm in thickness by laser annealing so as to be separated into the form of an island. The second insulating film 103 is formed of a silicon oxynitride film of 115 nm in thickness using monosilane (SiH₄) and dinitrogen oxide (N₂O) as source gas by plasma CVD. The first conductive layer 104 made of tungsten is formed in a thickness of 30 nm, the second conductive layer 105 made of aluminum that contains silicon is formed in a thickness of 500 nm, and the third conductive layer 106 made of titanium nitride is formed in a thickness of 20 nm. The mask pattern 107 is made of a positive photoresist in a thickness of 1.5 µm. The width of the mask pattern 107 may be set as appropriate, however, in this example, photolithographic processing is performed using mask patterns with widths of 4.5 µm and 10 µm (refer to FIG. 1A).

Figure 6:
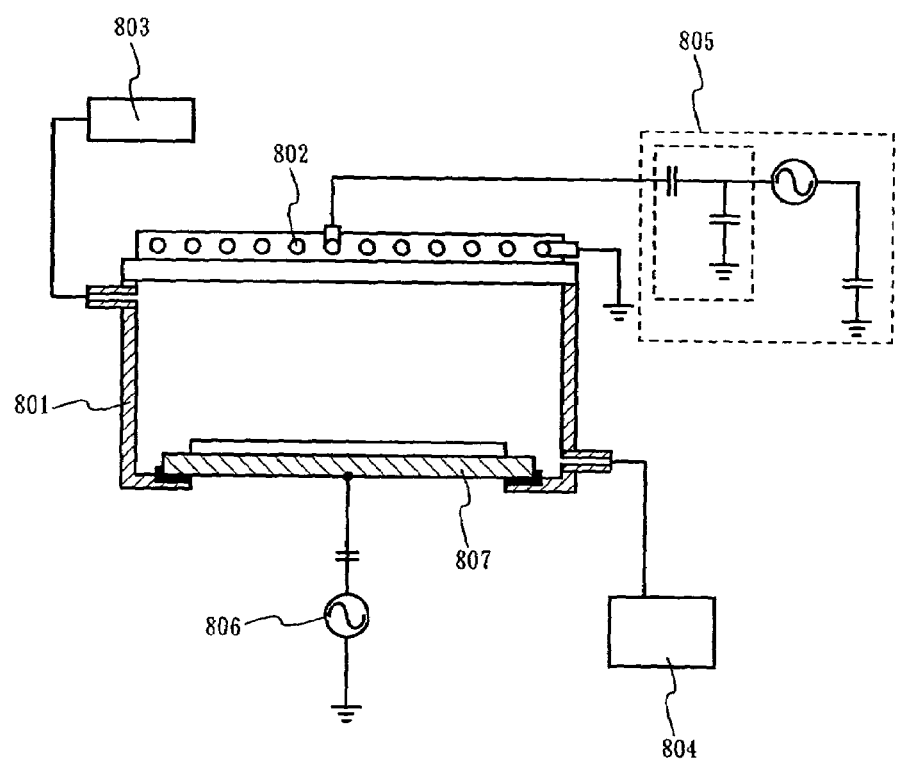
FIG. 6 is a diagram for explaining the arrangement of an inductively coupled plasma (ICP) etching device.
Figure 7:
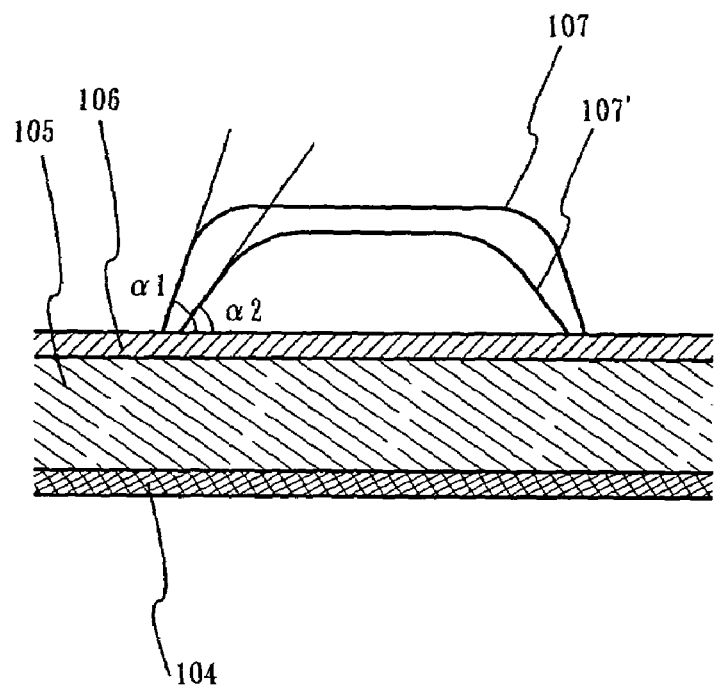
FIG. 7 is a diagram for explaining the change in the taper angle of a mask pattern.

Next, the second conductive layer (aluminum that contains silicon) 105 and the third conductive layer (titanium nitride) 106 are etched by dry etching. For etching, an ICP etching device is used. FIG. 6 shows the arrangement of the ICP etching device. A gas supply unit 803 for etching and an exhaust unit 804 for maintaining a reaction chamber 801 under reduced pressure are connected to the reaction chamber 801. A plasma generation unit comprises a spiral coil 802 for inductively coupling to the reaction chamber 801 through a quartz plate and a radiofrequency (13.56 MHz) power supply unit 805. A bias voltage is applied to the substrate side by a radiofrequency (13.56 MHz) power supply unit 806 to cause self-bias on a stage 807 having the substrate thereon. Main parameters for etching process are the type of etching gas to be supplied, radiofrequency power supplied by the radiofrequency (13.56 MHz) power supply units 806 and 807, and etching pressure.

Referring to FIG. 1B, a mixture of BCl₃, Cl₂, and CF₄ is used as etching gas. The etching pressure is set at 0.7 Pa and 800 W of power for generating plasma and 500 W of power for biasing the substrate are supplied. Referring then to FIG. 1C, the etching gas is changed to CF₄, Cl₂, and O₂ to etch tungsten that is the first conductive layer 104. The conditions for the etching are 1.0 Pa of etching pressure, and 500 W of power for generating plasma, and 20 W of power for biasing the substrate. In this way, the first conductive layer pattern 108 can be formed.

The edge of the photoresist mask pattern 107 is then recessed by oxygen plasma treatment. In the oxygen plasma treatment, the ICP etching device is used similarly, wherein 80 sccm of O₂ is supplied, and 450 W of power for generating plasma and 100 W of power for biasing the substrate are supplied under a treatment pressure of 1.2 Pa for 30 sec. The photoresist mask pattern 107 formed by the oxygen plasma treatment is reduced in width and film thickness (refer to FIG. 1D)

Figure 8:
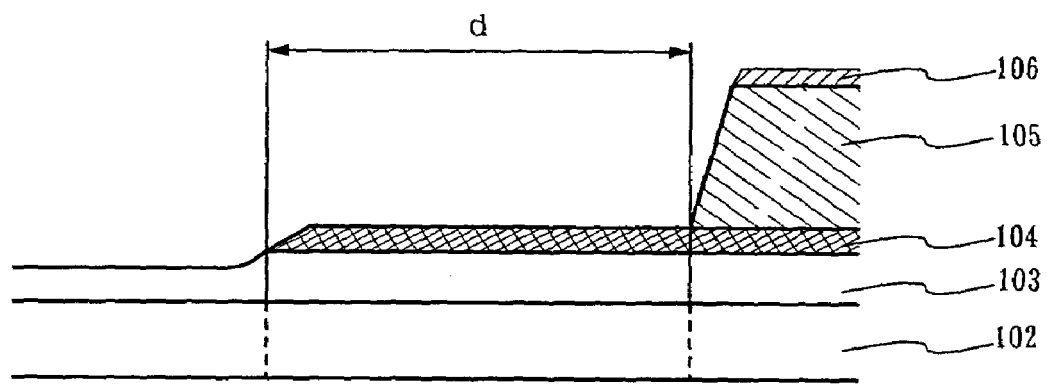
FIG. 8 is a diagram for explaining the relationship between the recess width d of a second conductive layer and the length Lov of a gate overlap TFT.

Subsequently, anisotropic etching is performed using a mixture of BCl₃ and Cl₂ as etching gas to mainly process the second conductive layer 105'. At that time, 500 W of power for generating plasma and 100 W of power for biasing the substrate are supplied under an etching pressure of 1.2 Pa. The edge of the second conductive layer 105' is recessed inward from the first conductive layer 104'. In this way, the second conductive layer pattern 109 is formed, which acts as a gate electrode at a portion intersecting with the semiconductor layer 102. The recess width from the edge of the first conductive layer 104' can be 1 to 2 µm. Referring to FIG. 8, the recess width d determines the length Lov. Table 1 shows a comparison of the recess widths d depending on whether or not the oxygen plasma treatment has been performed in a process similar to that of this embodiment.

TABLE 1

| Pattern width of mask | Oxygen plasma treatment performed | Oxygen plasma treatment not performed |
|---|---|---|
| 4.5 | 1.288 | 0.573 |
| 10.0 | 1.713 | 0.743 | unit: µm

As clearly shown in Table 1, when the oxygen plasma treatment was performed, the recess width d becomes 1.2 to 1.7 µm, depending on the pattern width of the mask, on the other hand, when the oxygen plasma treatment was not performed, the recess width d is as small as 0.5 to 0.7 µm.

Figure 9:
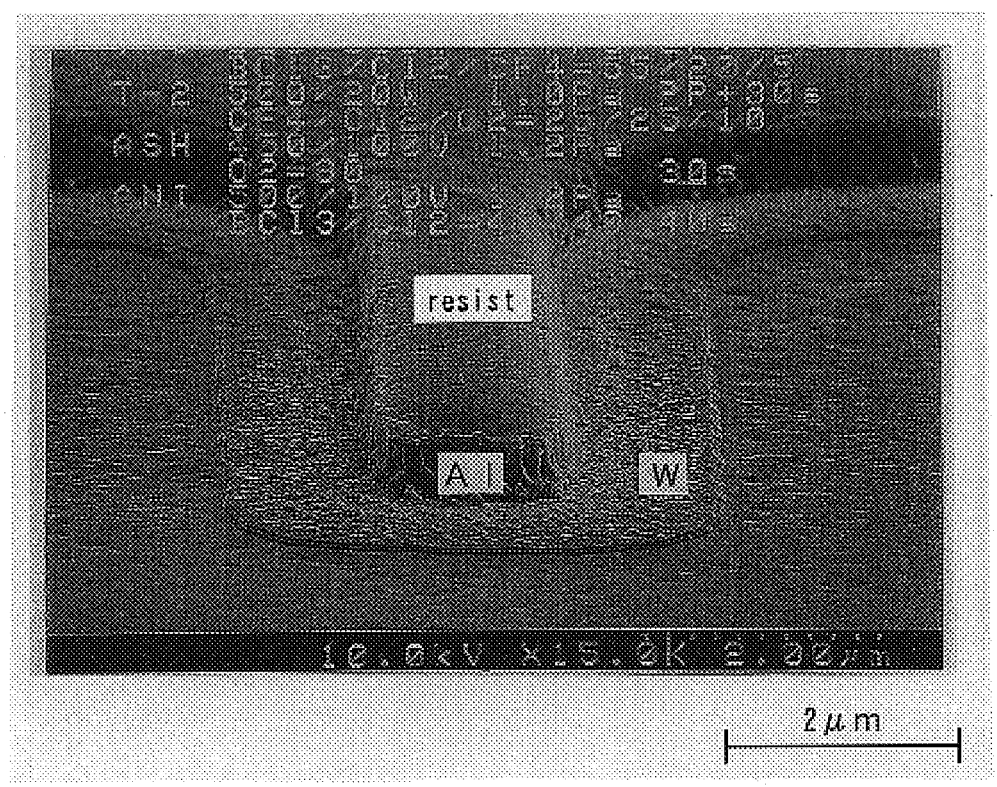
FIG. 9 is an image through a scanning electron microscope (SEM) showing the form of a conductive layer pattern that is etched according to a first embodiment.

FIG. 9 shows an image through a scanning electron microscope (SEM) showing a typical form when the oxygen plasma treatment has been applied, which shows a state in which a tungsten layer, an aluminum layer, and a resist mask are deposited from below. Said diagram shows an SEM image observed from an oblique direction, and the recess width of the aluminum layer or the projection width of the tungsten layer is estimated to be about 1.5 µm.

In the last stage of the etching process, the thickness of the mask pattern becomes approximately one-tenth of that in the initial stage. The recess width, however, can be freely set in consideration of the film thickness of the resist and the oxygen plasma treatment. In other words, the length Lov of a TFT having an LDD overlapping with the gate electrode (a gate-overlap TFT) can be freely set.

Thereafter, phosphorous or boron with a concentration of $1 \times 10^{16}$ to $5 \times 10^{18}/cm^3$ (peak value) is added to the first-concentration one-conduction type impurity region 110 comprising the LDD under an acceleration voltage of 50 kV by ion doping. (Refer to FIG. 2A)

In the doping process for forming a source/drain region, the second-concentration one-conduction type impurity region 111 is formed on the outside of the first-concentration one-conduction type impurity region 110 using the second conductive layer pattern 109 as a mask for shielding ions. In such a case, the concentration of phosphorous or boron is set at $1\times10^{19}$ to $5\times10^{21}/cm^3$ (peak value) under an acceleration voltage of 10 kV. (Refer to FIG. 2B)

After that, hydrogen-containing silicon oxynitride is formed in a thickness of 100 nm by plasma CVD and photosensitive or non-photosensitive acrylic or polyimide resin is formed in a thickness of 1 µm, thereby forming a fourth insulating film 113. Furthermore, the wire 114 is formed as necessary.

In this way, the LDD overlapping with the gate electrode (Lov) can be formed by self alignment and also the TFT with an Lov length of 1 µm or more can be formed.

Example 2

An example of producing a gate electrode according to the procedure of the second embodiment will be described. The present example will be discussed with reference to FIGS. 5A to 5E.

First, as in Example 1, the first insulating film 101 formed of a silicon oxynitride film, the semiconductor layer 102 formed of a crystalline silicon film, the second insulating film 103 formed of a silicon oxynitride film, the first conductive layer 104 (tungsten), the second conductive layer 105 (silicon-containing aluminum), the third conductive layer 106 (titanium nitride), and the mask pattern 107 are formed over the glass substrate 100 (refer to FIG. 5A).

Next, a process for decreasing the taper angle at the edge of the mask pattern 107 is performed by plasma treatment. At the same time, the third conductive layer 106 is reduced. $SF_6$ is used for the plasma treatment. 500 W of power for generating plasma and 300 W of power for biasing the substrate are supplied under a treatment pressure of 1.9 Pa. The process allows the third conductive layer 106 to be etched, and also the mask pattern 107 to be etched, thereby decreasing in the taper angle of the edge. (Refer to FIG. 5B).

Then, taper etching is performed, aimed at etching of aluminum contained in the second conductive layer 105. A mixture of $BCl_3$, $Cl_2$, and $CF_4$ is used as etching gas. 800 W of power for generating plasma and 500 W of power for biasing the substrate are supplied under an etching pressure of 0.7 Pa. (Refer to FIG. 5C).

Then, the etching gas is changed to a mixture of $CF_4$, $Cl_2$, and $O_2$ to etch tungsten that is the first conductive layer 104. The conditions for the etching are an etching pressure of 1.0 Pa, 500 W of power for generating plasma, and 20 W of power for biasing the substrate. In this way, the first conductive layer pattern 108 can be formed. (Refer to FIG. 5D)

Subsequently, anisotropic etching is performed using a mixture of $BCl_3$ and $Cl_2$ as etching gas to mainly process the second conductive layer 105'. 500 W of power for generating plasma and 100 W of power for biasing the substrate are supplied under an etching pressure of 1.2 Pa. The edge of the second conductive layer 105' is recessed inward from the first conductive layer 104'. (Refer to FIG. 5E)

In this way, the second conductive layer pattern 109 is formed, which acts as a gate electrode at a part intersecting with the semiconductor layer 102. The recess width from the edge of the first conductive layer 104' can be set at 1 to 2 µm. Table 2 shows a comparison of the recess widths d depending on whether or not the plasma treatment has been performed in a process similar to that of the embodiment.

TABLE 2

| Pattern width of mask | Plasma treatment performed | Plasma treatment not performed |
|---|---|---|
| 4.5 | 1.038 | 0.573 |
| 10.0 | 1.203 | 0.743 | unit: µm

As clearly shown in Table 2, when the plasma treatment was performed, the recess width increases by about 0.45 µm to be 1.0 to 1.2 µm, depending on the pattern width of the mask, on the other hand, when the plasma treatment was not performed, the recess width is as small as 0.5 to 0.7 µm.

Figure 10:
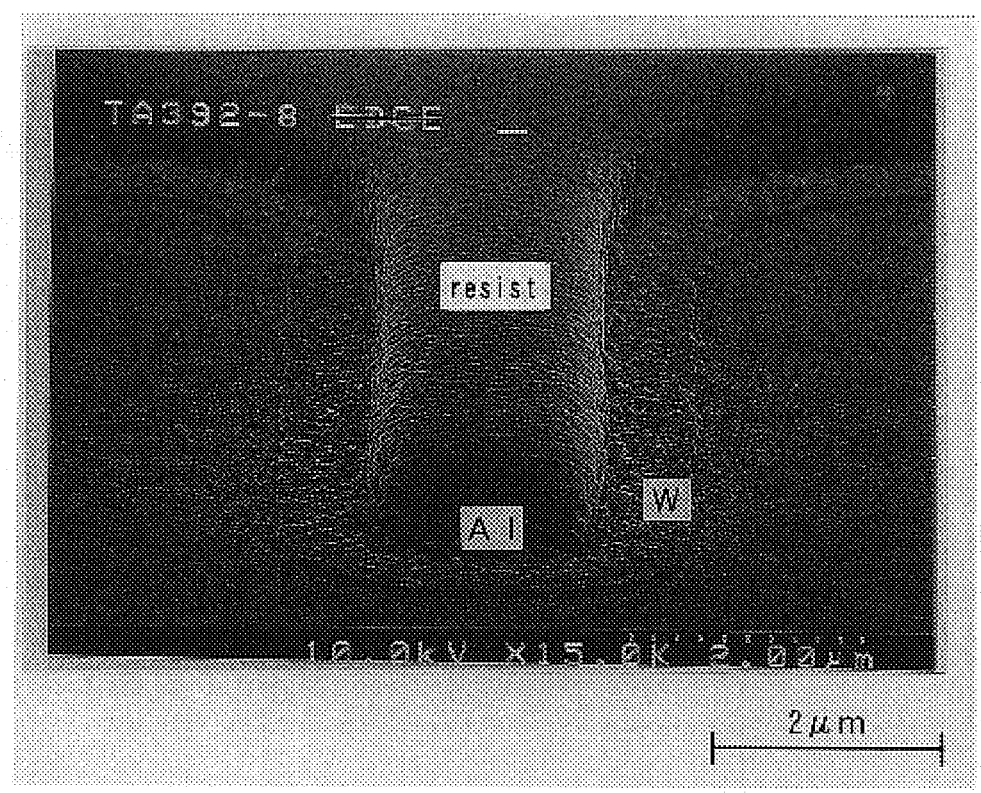
FIG. 10 is an SEM image showing the form of a conductive layer pattern that is etched according to a second embodiment.
Figure 11:
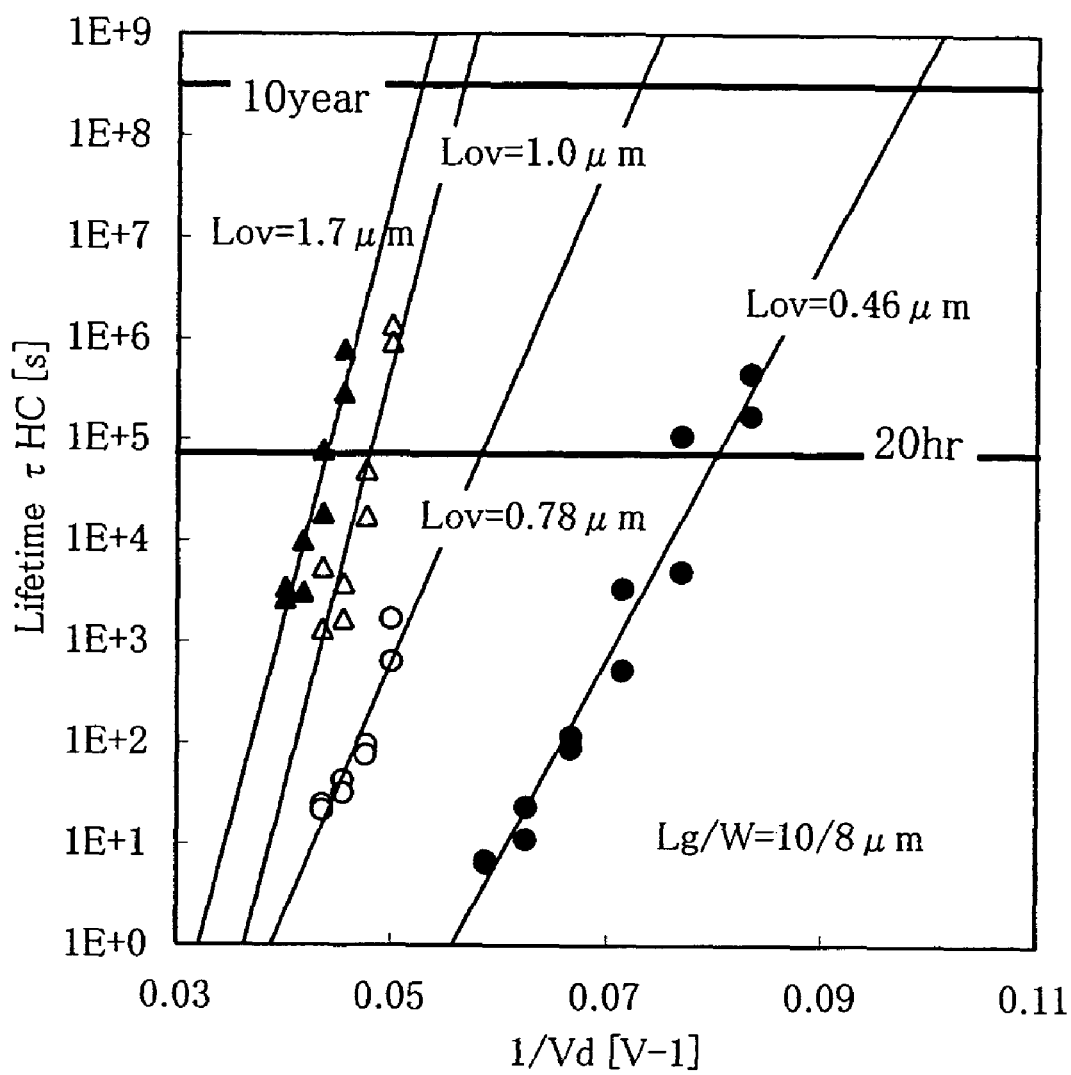
FIG. 11 is a characteristic diagram of estimated lifetime of a TFT in a bias stress test, plotting Lov dependency.
Figure 12:
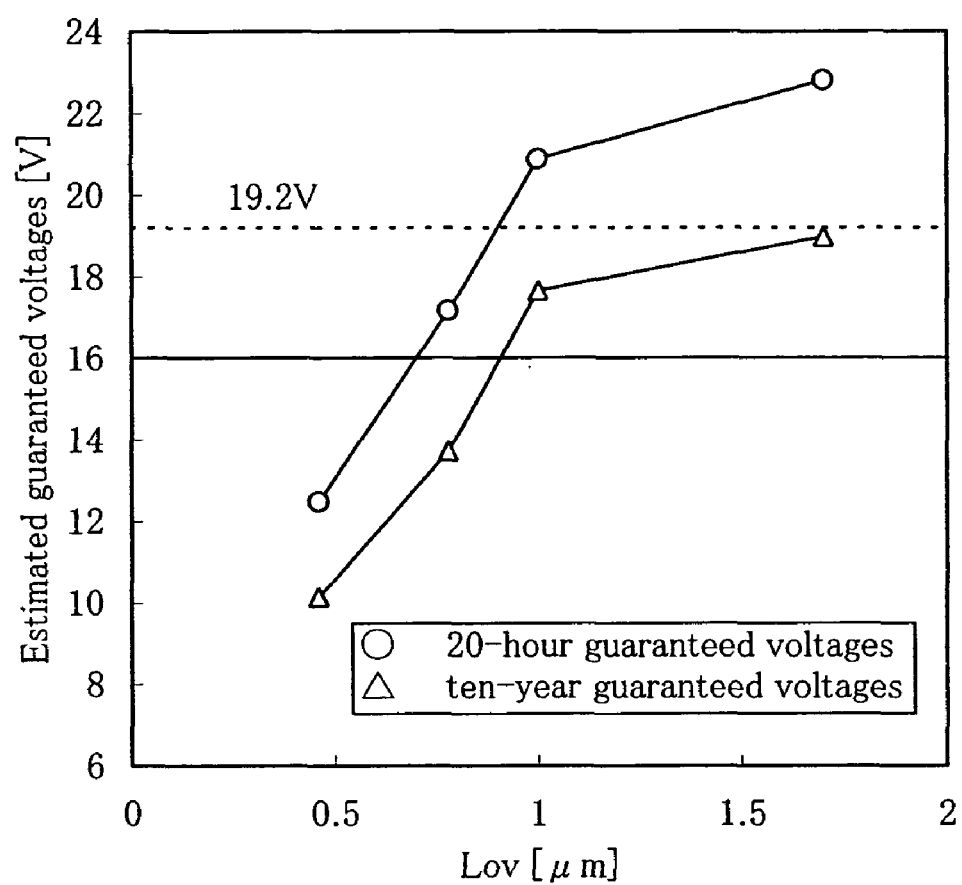
FIG. 12 is a graph showing the Lov dependency of an estimated guaranteed voltage (10%-deterioration of ON-state voltage)

FIG. 10 shows an SEM image showing a typical form when the plasma treatment has been applied, showing a laminate structure of a tungsten layer, an aluminum layer, and a resist mask from below. Said diagram shows an SEM image observed from an oblique direction, and the recess width of the aluminum layer or the projection width of the tungsten layer is estimated to be about 1.5 µm.

From then on, the gate overlap TFT can be formed as in Example 1.

Example 3

The invention can apply to semiconductor devices having various display screens. Particularly, the invention is useful for large-screen semiconductor devices whose display screens measure 20 inches or more diagonally.

Figure 14:
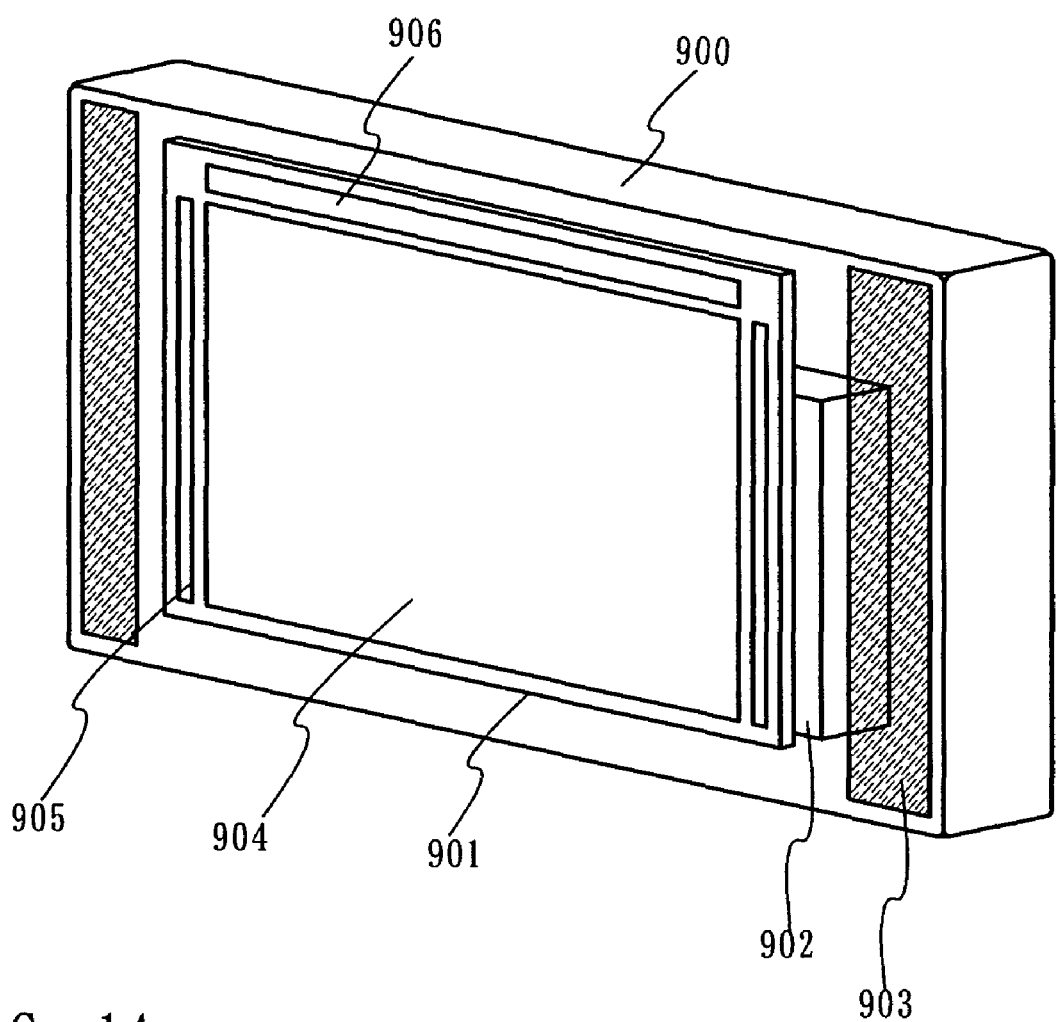
FIG. 14 is a diagram of an example of the semiconductor device.

FIG. 14 is a structural example of a semiconductor device having a display panel 901 mounted in a casing 900, which is applicable to television receivers and monitor systems of computers. The casing 900 comprises an electronic circuit board 902 and a speaker 903 for sound reproduction, the electronic circuit board 902 incorporating an amplifier, a radiofrequency circuit, and a semiconductor memory and a magnetic memory such as a hard disk acting as memory functions in a semiconductor integrated circuit to fulfill an image display function.

A display panel 901 can be of a driver-integral type of a combination of an active-matrix pixel circuit 904 in which TFTs are arranged in matrix form using the gate overlap TFTs according to the invention, a scanning-line driving circuit 905, and a data-line driving circuit 906.

Figure 13:
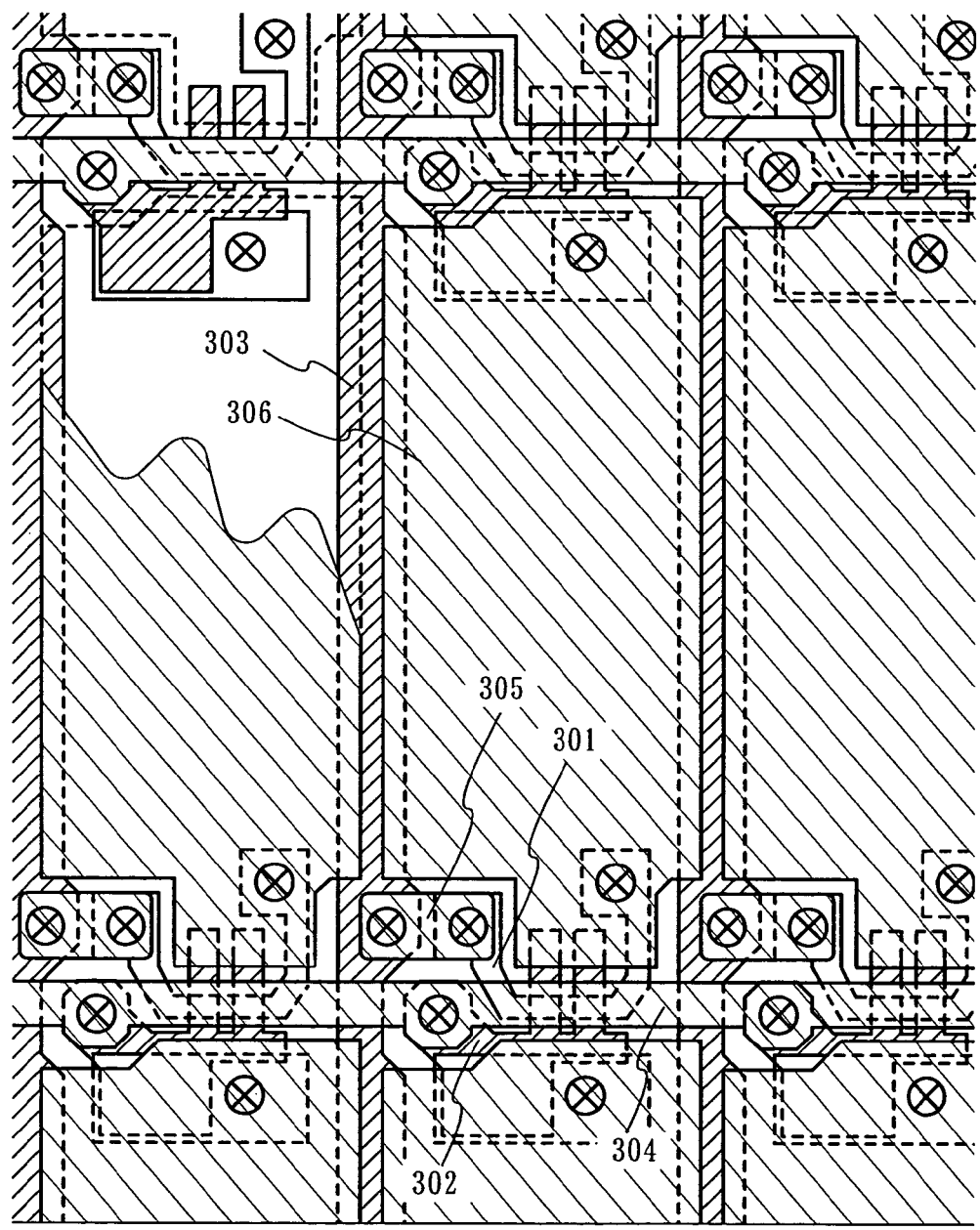
FIG. 13 is a top view showing the arrangement of active-matrix pixels of the semiconductor device according to the invention.

FIG. 13 is a diagram showing a principal arrangement of the active-matrix pixel circuit 904. A gate electrode 302 intersecting with a semiconductor layer 301 and a data signal line 303 are formed in the same layer. More specifically, it is formed of a laminate structure comprising at least one conductive layer using aluminum as the main component, and the gate electrode and the wiring pattern are formed by the etching process according to Example 1 or 2. In this manner, the gate overlap TFT with a length Lov of 1 µm or more can be formed, and the resistance of the data signal line can be decreased. A gate signal line 304 is formed over the upper layer thereof with an interlayer insulating film interposed therebetween and is in contact with the gate electrode 302 through a contact hole. Of course, the wire can be formed of aluminum, thereby decreasing the resistance of the wire. A wire 305 that connects the data signal line 303 and the semiconductor layer 301 can be formed in the same layer as that of the gate signal line 304. A pixel electrode 306 is made of indium tin oxide (ITO) that is the compound of indium oxide and titanium oxide. The details of such pixels are disclosed in JP2001-313397.

The embodiments have taken a semiconductor device as an example. However, the invention is not limited to the embodiments and can be applied to various other semiconductor devices. For example, it can be applied to various fields, in addition to navigation systems, sound-reproducing systems (such as car audio systems and component audio systems), notebook personal computers, game machines, personal digital assistants (such as mobile computers, cellular telephones, portable game machines, and electronic books), electrical home appliances such as refrigerators, washing machines, rice cookers, fixed telephones, vacuum cleaners, and clinical thermometers, and railroad wall banners and large-area information displays such as arrival and departure guide plates in railroad stations and airports.

Although the embodiments in the invention have been described as above, it is to be understood by those skilled in the art that various changes and modifications may be made without departing from the spirit and scope of the invention.

As described above, according to the invention, in the process of forming a gate electrode in a laminate structure comprising a plurality of conductive layers such that the width along the channel length of a first conductive layer is larger than that of a second conductive layer, a step of recessing a mask pattern into a long shape is provided between a taper etching process and an anisotropic etching process, so that the length along the channel of the first conductive layer can be 1 µm or more. The use of the gate electrode as a mask during ion doping allows the length of an LDD region overlapping with the gate electrode to be 1 µm or more and increases the lifetime of the TFT against hot-carrier-induced degradation.

According to the invention, a TFT that has an LDD overlapping with a gate electrode (Lov) and having its length of 1 µm or more can be formed by self alignment using the gate electrode as a mask during ion doping. Since the length of the LDD region overlapping with the gate electrode is 1 µm or more, the lifetime of the TFT can be increased against hot-carrier-induced deterioration.

What is claimed is:

1. A manufacturing method of a semiconductor device comprising:
   forming a laminate layer comprising a lower first conductive layer and an upper second conductive layer over a semiconductor layer with a gate insulating film interposed between the semiconductor layer and the conductive layers;
   forming a mask pattern over the laminate layer;
   forming a first conductive layer pattern having a tapered edge by etching the second conductive layer and the first conductive layer;
   after forming the first conductive layer pattern, recessing an edge of the mask pattern remaining on the first conductive layer pattern;
   after recessing the edge of the mask pattern, forming a second conductive layer pattern by selectively etching the second conductive layer in the first conductive layer pattern in accordance with the recessed mask pattern using a processing step different from a processing step used to recess the edge of the mask pattern remaining on the first conductive layer pattern; and
   forming an LDD region in a region of the semiconductor layer overlapping with the first conductive layer in the second conductive layer pattern by using the second conductive layer in the second conductive layer pattern as a mask for shielding ions accelerated by an electric field.

2. The method according to claim 1, wherein the first conductive layer is made of tungsten, and the second conductive layer is made of aluminum or metal having aluminum as the main component.

3. The method according to claim 1, wherein the edge of the mask pattern remaining on the first conductive layer pattern is recessed by oxygen plasma treatment.

4. A manufacturing method of a semiconductor device comprising:
   forming a laminate layer over a semiconductor layer by sequentially depositing a first conductive layer, a second conductive layer, and a third conductive layer with a gate insulating film interposed between the semiconductor layer and the conductive layers;
   forming a mask pattern on the laminate layer;
   forming a first conductive layer pattern having a tapered edge;
   after forming the first conductive layer pattern, recessing an edge of the mask pattern remaining on the first conductive layer pattern;
   after recessing the edge of the mask pattern, forming a second conductive layer pattern by selectively etching the third conductive layer and the second conductive layer in the first conductive layer pattern in accordance with the recessed mask pattern using a processing step different from a processing step used to recess the edge of the mask pattern remaining on the first conductive layer pattern; and
   forming an LDD region in a region of the semiconductor layer overlapping with the first conductive layer in the second conductive layer pattern by using the third conductive layer and the second conductive layer in the second conductive layer pattern as a mask for shielding ions accelerated by an electric field.

5. The method according to claim 4, wherein the first conductive layer is made of tungsten, the second conductive layer is made of aluminum or alloy or compound having aluminum as the main component, and the third conductive layer is made of titanium nitride.

6. The method according to claim 4, wherein the edge of the mask pattern remaining on the first conductive layer pattern is recessed by oxygen plasma treatment.

7. A manufacturing method of a semiconductor device comprising:
   forming a laminate layer comprising a lower first conductive layer and an upper second conductive layer over a semiconductor layer with a gate insulating film interposed between the semiconductor layer and the conductive layers;
   forming a mask pattern on the laminate layer;
   decreasing a taper angle of an edge of the mask pattern by performing plasma treatment;
   after decreasing the taper angle, forming a first conductive layer pattern having a tapered edge by etching the second conductive layer and the first conductive layer of the laminate layer by using the mask pattern;
   after forming the first conductive layer pattern, forming a second conductive layer pattern by selectively etching the second conductive layer in the first conductive layer pattern; and
   forming an LDD region in a region of the semiconductor layer overlapping with the first conductive layer in the second conductive layer pattern by using the second conductive layer in the second conductive layer pattern as a mask for shielding ions accelerated by an electric field.

8. The method according to claim 7, wherein the first conductive layer is made of tungsten, and the second conductive layer is made of aluminum or metal having aluminum as the main component.

9. The method according to claim 7, wherein the edge of the mask pattern remaining on the first conductive layer pattern is recessed by oxygen plasma treatment.

10. The method according to claim 7, wherein a width of the mask pattern is decreased by plasma treatment using a fluorine-based gas.

11. A manufacturing method of a semiconductor device comprising:
  forming a laminate layer over a semiconductor layer by sequentially depositing a first conductive layer, a second conductive layer, and a third conductive layer with a gate insulating film interposed between the semiconductor layer and the conductive layers;
  forming a mask pattern on the laminate layer;
  etching the third conductive layer and decreasing taper angle of an edge of the mask pattern by performing plasma treatment;
  after etching the third conductive layer and decreasing the taper angle, forming a first conductive layer pattern having a tapered edge by etching the second conductive layer and the first conductive layer of the laminate layer by using the mask pattern;
  after forming the first conductive layer pattern, forming a second conductive layer pattern by selectively etching the second and third conductive layers in the first conductive layer pattern; and
  forming an LDD region in a region of the semiconductor layer overlapping with the first conductive layer in the second conductive layer pattern by using the second and third conductive layers in the second conductive layer pattern as a mask for shielding ions accelerated by an electric field.

12. The method according to claim 11, wherein the edge of the mask pattern remaining on the first conductive layer pattern is recessed by oxygen plasma treatment.

13. The method according to claim 11, wherein a width of the mask pattern is decreased by plasma treatment using a fluorine-based gas.

14. The method according to claim 11, wherein the first conductive layer is made of tungsten, the second conductive layer is made of aluminum or an alloy or compound having aluminum as the main component, and the third conductive layer is made of titanium nitride.

15. A manufacturing method of a semiconductor device comprising:
  forming a laminate layer comprising a lower first conductive layer and an upper second conductive layer over a semiconductor layer with a gate insulating film interposed between the semiconductor layer and the conductive layers;
  forming a first shaped mask pattern over the laminate layer;
  forming a first conductive layer pattern having a tapered edge and a second shaped mask pattern by etching the second conductive layer and the first conductive layer;
  removing a portion of the second shaped mask pattern remaining on the first conductive layer pattern to form a third shaped mask pattern;
  forming a second conductive layer pattern by selectively etching the second conductive layer in the first conductive layer pattern in accordance with the third shaped mask pattern using a processing step different from a processing step used to form the third shaped mask pattern; and
  forming an LDD region in a region of the semiconductor layer overlapping with the first conductive layer in the second conductive layer pattern by using the second conductive layer in the second conductive layer pattern as a mask for shielding ions accelerated by an electric field.

16. The method according to claim 15, wherein the first conductive layer is made of tungsten, and the second conductive layer is made of aluminum or metal having aluminum as the main component.

17. A manufacturing method of a semiconductor device comprising:
  forming a laminate layer over a semiconductor layer by sequentially depositing a first conductive layer, a second conductive layer, and a third conductive layer with a gate insulating film interposed between the semiconductor layer and the conductive layers;
  forming a first shaped mask pattern over the laminate layer;
  forming a first conductive layer pattern having a tapered edge and a second shaped mask pattern by etching the third conductive layer, the second conductive layer and the first conductive layer;
  removing a portion of the second shaped mask pattern remaining on the first conductive layer pattern to form a third shaped mask pattern;
  forming a second conductive layer pattern by selectively etching the third conductive layer and the second conductive layer in the first conductive layer pattern in accordance with the third shaped mask pattern using a processing step different from a processing step used to form the third shaped mask pattern; and
  forming an LDD region in a region of the semiconductor layer overlapping with the first conductive layer in the second conductive layer pattern by using the third conductive layer and the second conductive layer in the second conductive layer pattern as a mask for shielding ions accelerated by an electric field.

18. The method according to claim 17, wherein the first conductive layer is made of tungsten, the second conductive layer is made of aluminum or an alloy or compound having aluminum as the main component, and the third conductive layer is made of titanium nitride.

* * * * *